United States Patent [19]
Fukazawa

[11] Patent Number: 5,470,393
[45] Date of Patent: Nov. 28, 1995

[54] SEMICONDUCTOR WAFER TREATING METHOD

[75] Inventor: Yuji Fukazawa, Yokohama, Japan

[73] Assignee: Kabushiki Kaisha Toshiba, Kawasaki, Japan

[21] Appl. No.: 271,960

[22] Filed: Jul. 8, 1994

[30] Foreign Application Priority Data

Aug. 2, 1993 [JP] Japan .................................. 5-191163

[51] Int. Cl.$^6$ ............................. B08B 3/08; B08B 7/04
[52] U.S. Cl. .................................. 134/3; 134/2; 134/26; 134/28
[58] Field of Search ................................. 134/2, 3, 26, 28, 134/29

[56] References Cited

U.S. PATENT DOCUMENTS

| | | | |
|---|---|---|---|
| 4,264,374 | 4/1981 | Beyer et al. ........................ | 134/29 X |
| 4,778,532 | 10/1988 | McConnell et al. .................. | 134/29 X |
| 5,129,955 | 7/1992 | Tanaka ............................ | 134/2 |
| 5,221,423 | 6/1993 | Sugino et al. ..................... | 134/2 X |
| 5,290,361 | 3/1994 | Hayashida et al. ................. | 134/2 |
| 5,308,400 | 5/1994 | Chen ............................. | 134/2 |

*Primary Examiner*—Jan H. Silbaugh
*Assistant Examiner*—Saeed T. Chaudhry
*Attorney, Agent, or Firm*—Finnegan, Henderson, Farabow, Garrett & Dunner

[57] ABSTRACT

A surface of a semiconductor water is washed with HF water solution, thereby removing an oxide film formed on a surface of the semiconductor water. Next, the surface of the semiconductor water is treated with mixed liquid of HF, HCl, $H_2O_2$, and deionized water. Then, the surface of the semiconductor wafer is treated with mixed liquid of HCl, $H_2O_2$, and deionized water, thereby removing the surface of the semiconductor wafer to remove metallic impurity such as Cu adhered onto the surface of the semiconductor wafer.

15 Claims, 2 Drawing Sheets

[5,470,393]

SEMICONDUCTOR WAFER TREATING METHOD

BACKGROUND OF THE INVENTION

1. Field of the Invention

The present invention relates to a semiconductor wafer treating method and more particularly to a semiconductor wafer treating method used to wash a surface of the semiconductor wafer.

2. Description of the Related Art

A conventional apparatus for treating a surface of the semiconductor wafer comprises first to third treating tanks for treating the surface of the semiconductor wafer. In the first treating tank, a first mixed liquid in which HF and deionized water (DIW) are mixed is contained. In the second treating tank, deionized water (DIW) is contained. In the third treating tank, a second mixed liquid in which HCl, $H_2O_2$, and deionized water (DIW) are mixed is contained.

In the above apparatus, firstly, the semiconductor wafer is dipped in the first treating tank for a predetermined period of time, and the surface of the wafer is treated with the first mixed liquid. This treatment is performed to remove an oxide film from the surface of the semiconductor wafer. Thereafter, the semiconductor wafer is taken out from the first treating tank. The wafer is dipped in the second treating tank for a predetermined period of time, and the surface of the wafer is washed with deionized water. Then, the semiconductor wafer is taken out from the second treating tank. The wafer is dipped in the third treating tank for a predetermined period of time, and the surface of the wafer is treated with the second mixed liquid. This treatment is used to remove Cu from the surface of the semiconductor wafer.

According to the above conventional semiconductor wafer treating method, even if the oxide film formed on the surface of the semiconductor is removed in the first treating tank, a native oxide film is formed again on the surface of the semiconductor wafer for the following three reasons.

Mover specifically, the first reason is as follows:

Since the wafer contacts air in moving the wafer into the second treating tank from the first treating tank, the native oxide film is formed again on the surface of the wafer.

The second reason is as follows;

In washing the wafer with deionized water in the second treating tank, the native oxide film is formed on the surface of the wafer by dissolved oxygen contained in the deionized water of the treating tank.

The third reason is as follows:

Since the wafer contacts air in moving the wafer into the third treating tank from the second treating tank, the native oxide film is formed on the surface of the wafer.

If the native oxide film is formed again on the surface of the semiconductor wafer, it becomes difficult to remove metal impurity material such as Cu from the surface of the semiconductor wafer by use of the second mixed liquid in the third treating tank.

FIG. 1 shows the relationship between treating time with deionized water and a rate of removing Cu from the wafer surface.

More specifically, after treating the surface of the semiconductor wafer with HF, the wafer is rinsed with deionized water whose concentration of dissolved oxygen is about 10 ppm. Cu is removed from the surface of the wafer with mixed liquid of HCl and $H_2O_2$. The wafer is rinsed with deionized water, and dried. The relationship between rinsing time (treating time with deionized water) and the rate of removing Cu from the wafer surface is shown in FIG. 1 in the above-mentioned case. From FIG. 1, it can be understood that the rate of removing Cu from the wafer surface becomes lower as treating time with deionized water becomes lower. This is because treating time with deionized water is made longer, so that the thickness of the native oxide film, which is formed on the surface of the semiconductor again, is thickened. In other words, difficulty in removing Cu from the wafer surface is increased as the thickness of the native oxide film becomes thicker.

FIG. 2 shows the relationship between time when the wafer is left to stand in air and a rate of removing Cu from the wafer surface. In other words, the surface of the semiconductor wafer is treated with HF. Thereafter, the wafer is left to stand in air having 50% of humidity, room temperature. Then, Cu is removed from the wafer surface with mixed liquid of HCl and $H_2O_2$. Thereafter, the wafer is rinsed by deionized water, and dried. The relationship between time when the wafer is left to stand in air and the rate of removing Cu from the wafer surface is shown in FIG. 2 in the above-mentioned case. From FIG. 2, it can be understood that the rate of removing Cu from the wafer surface becomes lower as time when the wafer is left to stand in air becomes longer. Therefore, difficulty in removing Cu from the wafer surface is increased as the thickness of the native oxide film, which is formed on the semiconductor wafer, becomes thicker.

SUMMARY OF THE INVENTION

An object of the present invention is to provide a semiconductor wafer treating method for efficiently removing impurity material from a surface of the semiconductor wafer by controlling the growth of a native oxide film.

The above object can be achieved by the following method.

More specifically, a method for treating a semiconductor wafer comprising a first step of treating a surface of a semiconductor wafer with HF water solution, thereby removing an oxide film formed on the surface of the semiconductor wafer; a second step, sequentially from the first step, of treating the surface of the semiconductor wafer with mixed liquid of the HF water solution, HCl water solution, and oxidizing agent; and a third step, sequentially from the second step, of treating the surface of the semiconductor wafer with mixed liquid of the HCl water solution, and the oxidizing agent.

According to the present invention, the surface of the semiconductor wafer is treated with HF water solution in the first step. Thereafter, the surface of the semiconductor water is treated with mixed liquid of HF water solution, HCl water solution, and oxidizing agent in the second step sequentially from the first step. Then, the surface of the semiconductor water is treated with mixed liquid of HF water solution and oxidizing agent in the third step sequentially from the second step. In this way, since the first, second, and third steps are sequentially performed, the growth of a native oxide film on the surface of the semiconductor wafer can be controlled. As a result, the surface of the semiconductor wafer can be treated with mixed liquid of HCl water solution and oxidizing agent in the third step in a state that the growth of the native oxide film is controlled. Therefore, impurity materials on the surface of the semiconductor wafer can be efficiently removed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

DETAILED DESCRIPTION OF THE PREFERRED EMBODIMENTS

An embodiment of the present invention will be explained with reference to the drawings.

Figure 1:
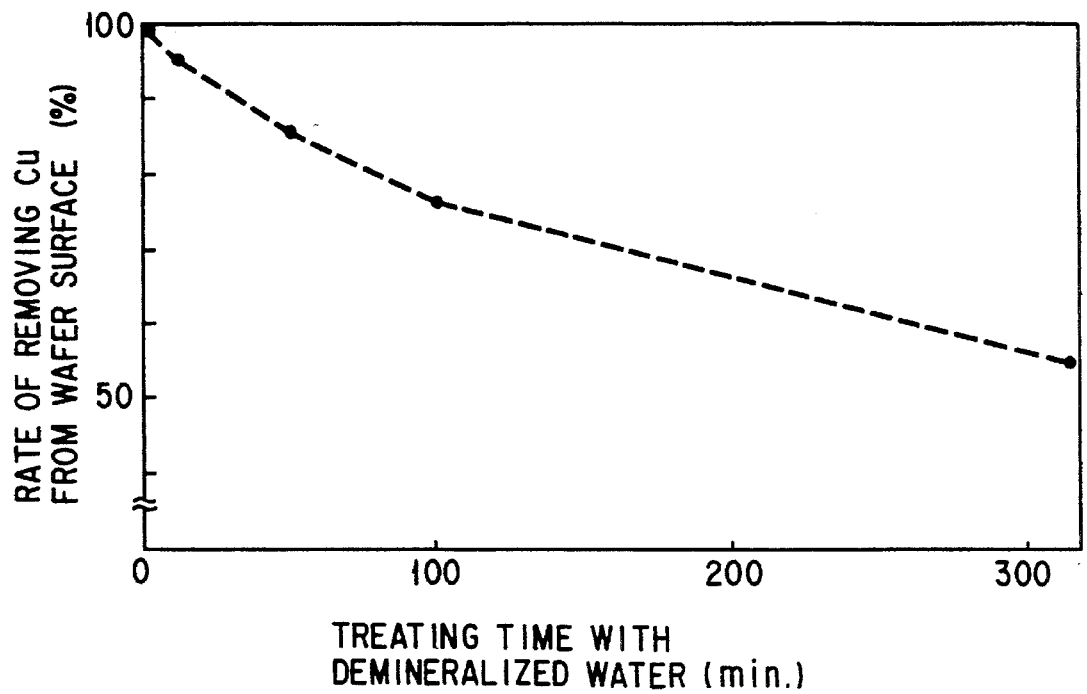
FIG. 1 is a graph showing the relationship between treating time with deionized water and a rate of removing Cu from the wafer surface.
Figure 2:
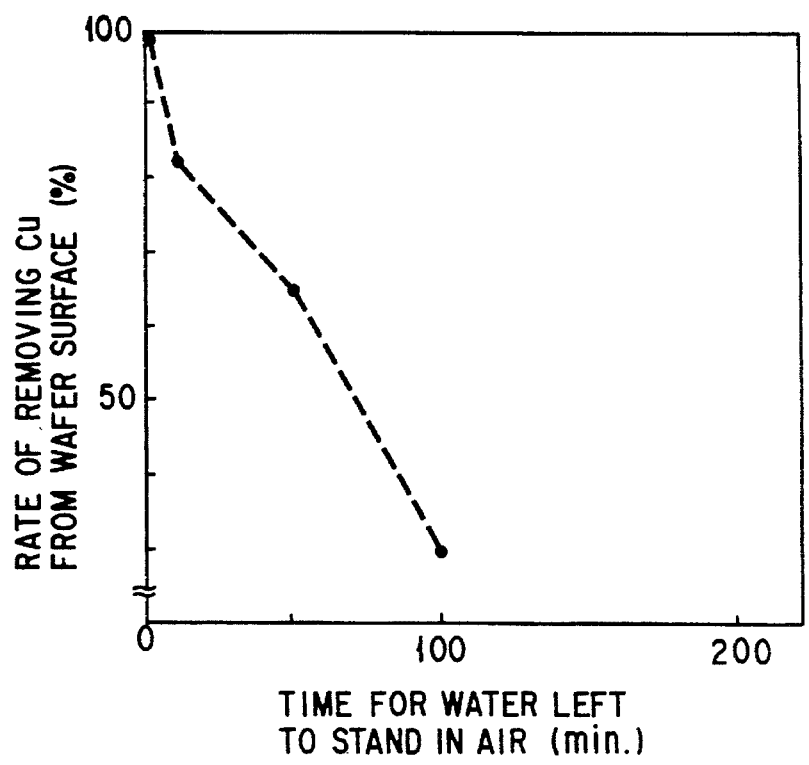
FIG. 2 is a graph showing the relationship between time when the wafer is left to stand in air and a rate of removing Cu from the wafer surface.
Figure 3:
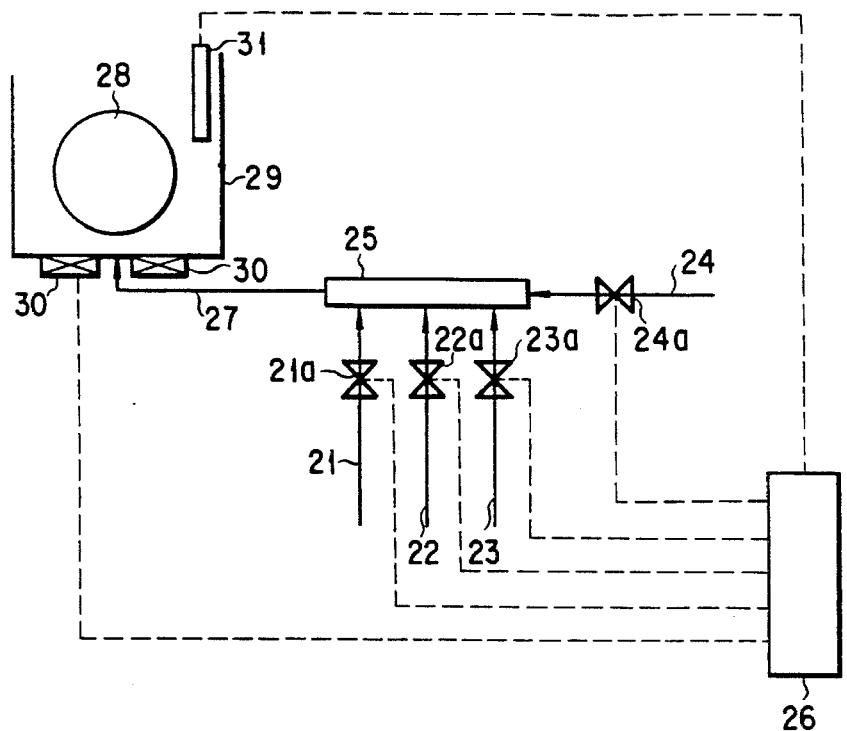
FIG. 3 is a structural view showing an apparatus for treating a surface of a semiconductor wafer of an embodiment of the present invention.

FIG. 3 is a structural view showing an apparatus for treating a surface of a semiconductor wafer of an embodiment of the present invention. An HF supply line 21, an HCl supply line 22, an oxidizing agent supply line, e.g., an $H_2O_2$ supply line 23, and a deionized water (DIW) line 24 are connected to a chemical liquid mixing apparatus 25 through first to fourth valves 21a to 24a, respectively. The opening/closing of each of the first to fourth valves 21a to 24a is controlled by a controller 26. The chemical liquid mixing apparatus 25 is connected to a treating tank 29 for treating a semiconductor wafer 28 by a chemical liquid supply line 27. The treating tank 29 is structured such that the supplied chemical liquid and deionized water are overflowed. In the treating tank 29, an ultrasonic generator 30 is provided. The ultrasonic generator 30 generates an ultrasonic wave to the semiconductor wafer 28 in washing the semiconductor wafer 28, thereby improving washing effect. In the treating tank 29, a measuring mechanism 31 for measuring concentration of chemical liquid is also provided. The ultrasonic generator 30 and the measuring mechanism 31 are controlled by the controller 26. The apparatus for treating the surface of the semiconductor wafer is structured such that concentration of chemical liquid in the treating tank 29 can be monitored by the measuring mechanism 31.

Figure 4A:
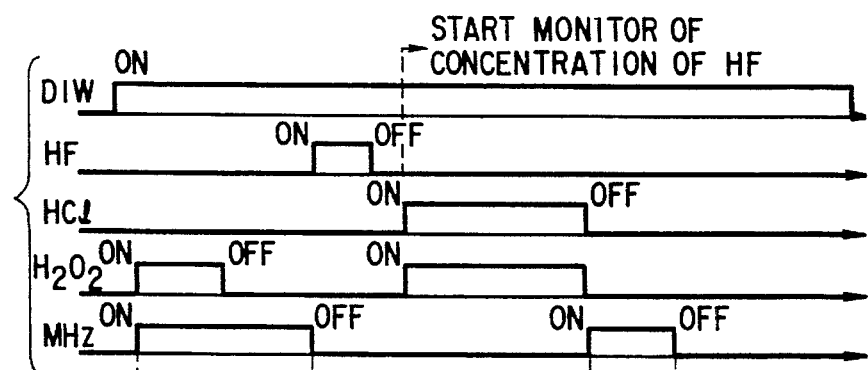
FIG. 4A is a timing chart showing an opening and closing operation of each of first to fourth valves or supplying chemical liquid of a treating tank in the the surface treating apparatus of FIG. 3.
Figure 4B:
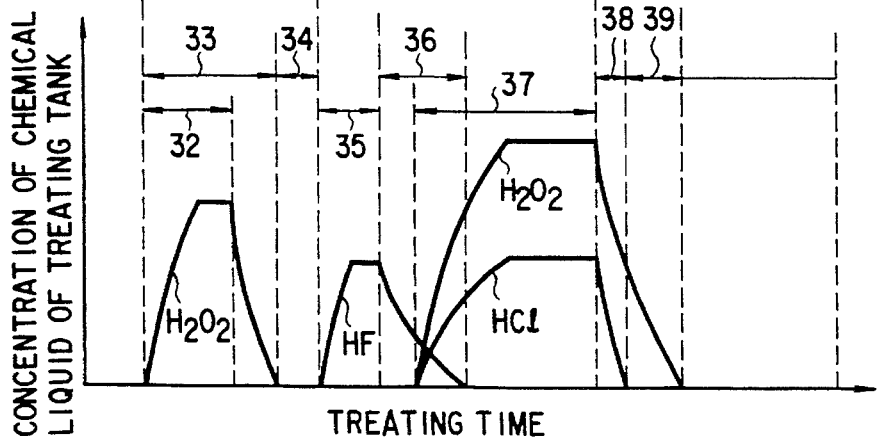
FIG. 4B is a view showing the relationship between concentration of the chemical liquid of the treating tank and treating time in the case that the chemical liquid is supplied as shown in FIG. 4A.

FIG. 4A is a timing chart showing the control of the opening and closing each of the first to fourth valves and that of the ultrasonic generator 30, respectively. FIG. 4B is a view showing the relationship between concentration of the chemical liquid of the treating tank and treating time in the case that the chemical liquid is supplied as shown in FIG. 4A.

In the above-mentioned structure, the first to fourth valves 21a to 24a of the semiconductor wafer treating apparatus of FIG. 3 are controlled to perform the supply of chemical liquid as shown in FIGS. 4A and 4B by the controller 26. Thereby, the surface of the semiconductor wafer 28 is washed in the treating tank 29.

In other words, the fourth valve 24a is opened by the controller 26. Thereby, deionized water (DIW) whose concentration of dissolved oxygen is about 10 ppm is supplied to the chemical liquid mixing apparatus 25 from the deionized water supply line 24. The deionized water is supplied to the treating tank 29 through the chemical liquid supply line 27. In this case, the amount of supply of deionized water is about 20 l/min. Then, the semiconductor wafer 28 is put in the treating tank 29. Thereafter, the third valve 23a is opened by the controller 26, so that $H_2O_2$ is supplied to the chemical liquid mixing apparatus 25 from the $H_2O_2$ supply line 23. At the same time, a switch of the ultrasonic generator 30 is turned on by the controller 26, so that an ultrasonic wave MHz is transmitted to the semiconductor wafer 28 in the treating tank 29.

Then, $H_2O_2$ and deionized water are mixed with each other in the chemical liquid mixing apparatus 25, and mixed liquid is supplied to the treating tank 29 from the chemical liquid supply line 27. In this case, in the treating tank 29, concentration of $H_2O_2$ is adjusted to about 3 weight %, and organic materials (not shown) or particles (not shown), which are adhered to the surface of the semiconductor wafer 28, are removed by $H_2O_2$. After passing a first period of time 32, the third valve 23a is closed by the controller 26, so that the supply of $H_2O_2$ to the chemical liquid mixing apparatus 25 is stopped. At this time, the supply of deionized water to the chemical liquid mixing apparatus 25 is continued. Due to this, after passing a second period of time 33, $H_2O_2$ of the treating tank 29 is completely lost.

After passing a third period of time 34, the switch of the ultrasonic generator 30 is turned off by the controller 26. At the same time, the first valve 21a is opened by the controller 26, so that HF is supplied to the chemical liquid mixing apparatus 25 from the HF supply line 21. Thereafter, HF is supplied to the treating tank 29 by the chemical liquid supply line 27. Thereby, in the treating tank 29, concentration of HF is adjusted to about 0.2 weight %, and an oxide film, Fe, Al (which are not shown in the figure) on the surface of the semiconductor wafer 28 are removed by HF.

Thereafter, after passing a fourth period of time 35, which is specifically about 5 minutes, the first valve 21a is closed by the controller 26, so that the supply of HF to the chemical liquid mixing apparatus 25 is stopped. Thereafter, the supply of deionized water to the chemical liquid mixing apparatus 25 is continued. Due to this, concentration of HF in the treating tank 29 is gradually lowered. Then, after passing a fifth period of time 36, HF of the treating tank 29 is completely lost. Before HF of the treating tank 29 is completely lost after closing the first valve 21a, second and third valves 22a and 23a are opened by the controller 26.

More specifically, in gradually reducing concentration of HF, concentration of HF of the treating tank 29 is monitored by the chemical liquid concentration measuring mechanism 31. Then, when concentration of HF reaches 100 ppm, the second and third valves 22a and 23a are opened by the controller 26. Thereby, HCl and $H_2O_2$ are supplied to the chemical liquid mixing apparatus 25 from the HCl supply line 22 and $H_2O_2$ supply line 23. The mixed liquid in which HCl and $H_2O_2$ are mixed in the chemical liquid mixing apparatus 25 is supplied to the treating tank 29. For measuring concentration of HF, the chemical liquid concentration measuring mechanism 31 uses a method in which a resistivity value of the liquid is measured, and concentration of HF is obtained by use of the resistivity and a specific resistivity of deionized water.

As mentioned above, HF of the treating tank 29 is completely lost, and concentration of HCl and that of $H_2O_2$ in the treating tank 29 are adjusted to about 0.5 weight % and about 1 weight %, respectively. Thereby, Cu and Au (not shown) on the surface of the semiconductor wafer 28 are removed. Thereafter, the switch of the ultrasonic generator 30 is turned on by the controller 26, and ultrasonic wave MHz is transmitted to the semiconductor wafer 28 in the treating tank 29.

After passing a sixth period of time 37, specifically about 10 minutes, the second and third valves 22a and 23a are simultaneously closed, supply of HCl and that of $H_2O_2$ to the treating tank 29 are stopped. Then, concentration of HCl and that of $H_2O_2$ of the treating tank 29 are gradually lowered. After passing a seventh period of time 38, HCl of the treating tank 29 is completely lost. Then, after passing an eighth period of time 39, $H_2O_2$ of the treating tank 29 is completely lost. As a result, only deionized water is supplied to the treating tank 29.

In the above-explained embodiment, concentration of HF of the treating tank 29 is gradually lowered. Then, when concentration reaches 100 ppm, the second and third valves 22a and 23a are opened, so that HCl and $H_2O_2$ are supplied to the treating tank 29. However, HCl and $H_2O_2$ may be supplied to the treating tank 29 by opening the second and third valves 22a and 23a when concentration of HF reaches over 10 ppm and below 100 ppm. The most desirable time for supplying HCl and $H_2O_2$ to the treating tank 29 is when concentration of HF reaches a minimum concentration for restraining the growth of a native oxide film.

Also, in the above-explained embodiment, $H_2O_2$ is supplied to the chemical liquid mixing apparatus 25 by the $H_2O_2$ supply line 23. However, $O_3$ water, that is, ozonized water may be supplied to the chemical liquid mixing apparatus 25 by an $O_3$ water supply line. Moreover, $HNO_3$ solution may be supplied to the chemical liquid mixing apparatus 25 by an $HNO_3$ solution supply line.

According to the above-explained embodiment, when the supply of HF to the treating tank 29 is stopped, concentration of HF of the treating tank 29 is gradually lowered, and concentration of HF reaches 100 ppm, HCl and $H_2O_2$ are supplied to the treating tank 29. Due to this, before the native oxide film is formed on the surface of the semiconductor wafer 28 due to dissolved oxygen contained in deionized water, it is possible to remove metallic impurity materials such as Cu and Au, which are adhered to the surface of the semiconductor wafer 28, with mixed liquid of HCl and $H_2O_2$. Therefore, as compared with the conventional treating method of the semiconductor wafer, the rate of removing metallic impurity materials, which are formed on the surface of the semiconductor wafer 28, can be largely improved.

In other words, for removing metallic impurity materials such as Cu and Au, which are adhered to the surface of the semiconductor wafer 28, the metallic impurity materials cannot be sufficiently removed if the oxide film is formed on the surface of the wafer 28. Due to this, in order that the oxide film is not formed again after removing the oxide film on the surface of the wafer 28 with HF, HCl and $H_2O_2$ are supplied to the treating tank 29 when concentration of HF of the treating tank 29 reaches 100 ppm. In other words, the process can be advanced from the oxide film removing process to the metallic impurity material removing process without setting the inside of the treating tank 29 to a state of deionized water containing dissolved oxygen. Thereby, the growth of the native oxide film due to dissolved oxygen contained in deionized water can be restrained. Therefore, the rate of removing metallic impurity materials, which are formed on the surface of the semiconductor wafer 28, can be largely improved. As a method for restraining the growth of the native oxide film, it can be considered that concentration of dissolved oxygen contained in deionized water is sufficiently lowered. However, it impossible to perform such a method from a technical viewpoint.

According to the above-explained embodiment, in the process for removing the oxide film, which is formed on the surface of the semiconductor wafer 28, HF and deionized water are continued to be supplied in a state that the first and fourth valves 21a and 24a are opened. However, the first and fourth valves 21a and 24a are opened. Then, after concentration of HF of the treating tank 29 reaches about 0.2 weight %, the first and fourth valves 21a and 24a are closed. In such a state, the semiconductor wafer 28 can be dipped in the treating tank for a predetermined period of time.

Moreover, in the above-explained embodiment, since deionized water whose concentration of dissolved oxygen is about 10 ppm is used, HCl and $H_2O_2$ are supplied to the treating tank 29 when concentration of HF reaches about 10 ppm to 100 ppm. However, in a case that deionized water whose concentration of dissolved oxygen is about 5 ppm is used, HCl and $H_2O_2$ may be supplied to the treating tank 29 when concentration of HF reaches about 0.1 ppm.

Furthermore, in the above-explained embodiment, when concentration of HF reaches about 100 ppm, second and third valves 22a and 23a are opened, so that HCl and $H_2O_2$ are simultaneously supplied to the chemical liquid mixing apparatus 25. However, when concentration of HF reaches about 100 ppm, the second valve 22a are opened, so that HCl can be first supplied to the chemical liquid mixing apparatus 25. Then, the third valve 23a is opened, thereby $H_2O_2$ can be supplied to the chemical liquid mixing apparatus 25 a little later.

Moreover, in the above-explained embodiment, the treating tank 29 is structured such that the supplied chemical liquid and deionized water are overflowed. However, there can be used a method in which the semiconductor wafer surface treating apparatus is formed of a plurality of treating tanks, and the semiconductor wafer is dipped into the other treating tank every process.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method for treating a semiconductor wafer, comprising:

a first step of treating a surface of a semiconductor wafer with about a 0.2 weight % HF water solution, thereby removing an oxide film formed on the surface of said semiconductor wafer;

a second step, sequentially from said first step, of treating the surface of said semiconductor wafer with a mixture of between 0.1 ppm and 100 ppm HF water solution, a HCl water solution, and an oxidizing agent; and a third step, sequentially from said second step, of treating the surface of said semiconductor wafer with a mixture of about a 0.5 weight % HCl water solution and about a 1 weight % concentration of an oxidizing agent.

2. The method according to claim 1, wherein HF water solution of said second step is a part of HF water solution of said first step, and HCl water solution and oxidizing agent of the mixed liquid of said third step are a part of HCl water solution and that of oxidizing agent of the mixed liquid of said second step, respectively.

3. The method according to claim 1, wherein concentration of HF of HF water solution of said first step is controlled by supplying only an amount of each of HF water solution and deionized water to said treating tank, and by discharging mixed liquid of HF water solution and deionized water from said treating tank, concentration of each of HCl and oxide material of the mixed liquid of said second step is controlled by supplying only an amount of each of HCl water solution, oxidizing agent and deionized water to said treating tank, and by discharging mixed liquid of HF water solution, HCl water solution, oxidizing agent and deionized water from said treating tank, and concentration of each of HCl and oxide material of the mixed liquid of said third step is controlled by supplying only an amount of each of HCl water solution, oxidizing agent and deionized water to said treating tank, and by discharging mixed liquid of HCl water solution, oxidizing agent and deionized water from said treating tank.

4. A method for treating a semiconductor wafer, comprising:

a first step of treating a surface of a semiconductor wafer with about a 3 weight % concentration of an oxidizing agent, thereby removing particles formed on the surface of said semiconductor wafer;

a second step of treating the surface of said semiconductor wafer with about a 0.2 weight % HF water solution, thereby removing an oxide film formed on the surface of said semiconductor wafer;

a third step, sequentially from said second step, of treating the surface of said semiconductor wafer with a mixture of between a 0.1 ppm and 100 ppm HF water solution, an HCl water solution, and an oxidizing agent; and a fourth step, sequentially from said third step, of treating the surface of said semiconductor wafer with a mixture of about a 0.5 weight % HCl water solution and about a 1 weight % concentration of an oxidizing agent.

5. The method according to claim 4, wherein said oxidizing agent is $H_2O_2$ water solution or $NHO_3$ water solution or $O_3$ water.

6. The method according to claim 4, wherein HF water solution of said third step is a part of HF water solution of said second step, and HCl water solution and oxidizing agent of said fourth are a part of HCl water solution and that of oxidizing agent of said third step, respectively.

7. The method according to claim 4, wherein concentration of oxide material of oxidizing agent of said first step is controlled by supplying only an amount of each of oxidizing agent and deionized water to said treating tank, and by discharging mixed liquid of oxidizing agent and deionized water from said treating tank, concentration of HF of HF water solution of said second step is controlled by supplying only an amount of each of HF water solution and deionized water to said treating tank, and by discharging mixed liquid of HF water solution and deionized water from said treating tank, concentration of each of HCl and oxide material of the mixed liquid of said third step is controlled by supplying only an amount of each of HCl water solution, oxidizing agent and deionized water to said treating tank, and by discharging mixed liquid of HF water solution, HCl water solution, oxidizing agent and deionized water from said treating tank, and concentration of each of HCl and oxide material of the mixed liquid of said fourth step is controlled by supplying only an amount of each of HCl water solution, oxidizing agent and deionized water to said treating tank, and by discharging mixed liquid of, HCl water solution, oxidizing agent and deionized water from said treating tank.

8. A method for treating a surface of a semiconductor wafer, comprising the steps of:

supplying HF to a treating tank accommodating a semiconductor wafer and filled with deionized water until an HF concentration attains about a 0.2 weight % concentration, thereby removing an oxide film formed on the surface of a semiconductor wafer;

terminating the HF supply to said treating tank and supplying deionized water to said treating tank while the HF solution is allowed to overflow from the treating tank, followed by supplying HCl to about 0.5 weight % and an oxidizing agent to about 1 weight to said treating tank when the HF concentration falls within the range from 100 ppm to 0.1 ppm, thereby removing metallic impurities attached to the surface of said semiconductor wafer; and terminating the supply of said HCl and said oxidizing agent followed by supplying deionized water while a mixture of the HCl water solution and said oxidizing agent is allowed to overflow the treating tank, thereby lowering the concentrations of said HCl and said oxidizing agent in said treating tank and filling said treating tank substantially with deionized water.

9. The method according to claim 8, further comprising the following steps, prior to said HF supplying step to remove an oxide film formed on the surface of the semiconductor wafer, of:

supplying deionized water to the treating tank;

accommodating the semiconductor wafer in said treating tank followed by soaking said semiconductor wafer in the deionized water;

supplying an oxidizing agent to said treating tank to a concentration of about 3 weight % while the deionized water is allowed to overflow the tank, thereby removing particles attached on the surface of the semiconductor wafer; and terminating the supply of the oxidizing agent and supplying deionized water while said water solution of said oxidizing agent is allowed to overflow the tank, thereby lowering the concentration of said oxidizing agent in said treating tank and filling the treating tank substantially with deionized water.

10. The method according to claim 8, wherein said oxidizing agent is at least one selected from the group consisting of $H_2O_2$, $HNO_3$, and $O_3$.

11. A method for treating a surface of a semiconductor wafer, comprising the steps of:

supplying HF to a treating tank accommodating said semiconductor wafer and filled with deionized water until an HF concentration attains about a 0.2 weight % concentration, thereby removing an oxide film formed on the surface of the semiconductor wafer;

terminating the HF supply to said treating tank and supplying deionized water while the HF water solution is allowed to overflow from said treating tank, followed by supplying HCl to said treating tank to about 0.5 weight % when the HF concentration falls within a range from 100 ppm to 0.1 ppm;

supplying an oxidizing agent to said treating tank to a concentration of about 1 weight %; and supplying deionized water while a mixture of said HCl water solution and a water solution of said oxidizing agent is allowed to overflow the tank, thereby reducing the concentrations of said HCl and said oxidizing agent in said treating tank and filling said treating tank substantially with deionized water.

12. The method according to claim 11, further comprising the following steps, prior to said HF supplying step to remove an oxide film formed on the surface of said semiconductor wafer, of:

supplying deionized water to the treating tank;

accommodating the semiconductor wafer in said treating tank followed by soaking said semiconductor wafer in deionized water;

supplying an oxidizing agent to said treating tank to about 3 weight % while deionized water is allowed to overflow the tank, thereby removing particles attached on the surface of said semiconductor wafer; and terminating the supply of the oxidizing agent and supplying deionized water while the water solution of said oxidizing agent is allowed to overflow, thereby lowering the concentration of said oxidizing agent in said treating tank and filling the treating tank substantially with deionized water.

13. The method according to claim 11, wherein said oxidizing agent is at least one selected from the group consisting of $H_2O_2$, $HNO_3$, and $O_3$.

14. A method for treating a surface of a semiconductor wafer, comprising the steps of:

supplying HF to a treating tank filled with deionized water to a concentration of about 0.2 weight %;

soaking said semiconductor wafer in the HF water solution in said treating tank, thereby removing an oxide film formed on the surface of the semiconductor wafer;

supplying deionized water while said HF solution is allowed to overflow from the treating tank, followed by supplying HCl to about 0.5 weight % and an oxidizing agent to about 1 weight % to said treating tank when the HF concentration falls within a range from 100 ppm to 0.1 ppm, thereby removing metallic impurities attached on a surface of said semiconductor wafer; and terminating said supply of HCl and said oxidizing agent followed by supplying deionized water while a mixed liquid of an HCl water solution and a water solution of said oxidizing agent is allowed to overflow the tank, thereby lowering the concentrations of HCl and said oxidizing agent in said treating tank and filling said treating tank substantially with deionized water.

15. The method according to claim 14, wherein said oxidizing agent is at least one selected from the group consisting of $H_2O_2$, $HNO_3$, and $O_3$.

* * * * *